US012813002B2

(12) United States Patent
Wei et al.

(10) Patent No.: US 12,813,002 B2
(45) Date of Patent: Nov. 24, 2026

(54) ANCHOR STRUCTURES AND METHODS FOR UNIFORM WAFER PLANARIZATION AND BONDING

(71) Applicant: Taiwan Semiconductor Manufacturing Co., Ltd., Hsinchu (TW)

(72) Inventors: Chia-Yu Wei, Tainan City (TW); Cheng-Yuan Li, Kaohsiung City (TW); Hsin-Chi Chen, Tainan City (TW); Kuo-Cheng Lee, Tainan City (TW); Hsun-Ying Huang, Tainan City (TW); Yen-Liang Lin, Tainan City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/232,751

(22) Filed: Aug. 10, 2023

(65) Prior Publication Data

US 2023/0387172 A1 Nov. 30, 2023

Related U.S. Application Data

(60) Continuation of application No. 17/504,308, filed on Oct. 18, 2021, now Pat. No. 11,817,472, which is a (Continued)

(51) Int. Cl.

*H10F 39/00* (2025.01)
*H10F 39/12* (2025.01)
*H10F 39/18* (2025.01)

(52) U.S. Cl.

CPC .......... *H10F 39/811* (2025.01); *H10F 39/011* (2025.01); *H10F 39/018* (2025.01);

(Continued)

(58) Field of Classification Search

CPC ............ H01L 27/146; H01L 27/14603; H01L 27/1463; H01L 27/14634; H01L 27/14636;

(Continued)

(56) References Cited

U.S. PATENT DOCUMENTS 7,495,206 B2 2/2009 Park
9,252,169 B2 2/2016 Kobayashi et al.

(Continued)

FOREIGN PATENT DOCUMENTS

CN 1822379 A 8/2006
CN 103247603 A 8/2013

(Continued)

OTHER PUBLICATIONS

Chinese Office Action, dated Jul. 8, 2021, for Chinese Intellectual Property Office Appl. No. 201811384924.0, 10 pages.

*Primary Examiner* — Dmitriy Yemelyanov
(74) *Attorney, Agent, or Firm* — Sterne, Kessler, Goldstein & Fox P.L.L.C.

(57) ABSTRACT

The present disclosure is directed to anchor structures and methods for forming anchor structures such that planarization and wafer bonding can be uniform. Anchor structures can include anchor layers formed on a dielectric layer surface and anchor pads formed in the anchor layer and on the dielectric layer surface. The anchor layer material can be selected such that the planarization selectivity of the anchor layer, anchor pads, and the interconnection material can be substantially the same as one another. Anchor pads can provide uniform density of structures that have the same or similar material.

20 Claims, 7 Drawing Sheets

Related U.S. Application Data division of application No. 16/055,758, filed on Aug. 6, 2018, now Pat. No. 11,152,417.

(60) Provisional application No. 62/589,463, filed on Nov. 21, 2017.

(52) U.S. Cl.
CPC ......... *H10F 39/199* (2025.01); *H10F 39/809* (2025.01); *H10F 39/18* (2025.01); *H10F 39/807* (2025.01)

(58) Field of Classification Search
CPC ........... H01L 27/1464; H01L 27/14643; H01L 27/14683; H01L 27/1469
See application file for complete search history.

(56) References Cited

U.S. PATENT DOCUMENTS

| | | | | |
|---|---|---|---|---|
| 9,257,399 | B2 | 2/2016 | Kuang et al. | |
| 9,299,736 | B2 | 3/2016 | Chen et al. | |
| 9,917,123 | B2 | 3/2018 | Chen et al. | |
| 10,090,351 | B2 | 10/2018 | Ashidate et al. | |
| 10,332,927 | B2 | 6/2019 | Haneda | |
| 10,355,039 | B2 | 7/2019 | Kotoo et al. | |
| 10,485,293 | B2 | 11/2019 | Hagimoto et al. | |
| 2002/0003307 | A1* | 1/2002 | Suga | H01L 24/31 438/455 |
| 2002/0074670 | A1* | 6/2002 | Suga | H01L 21/768 257/E23.114 |
| 2006/0146233 | A1* | 7/2006 | Park | H01L 27/1464 349/95 |
| 2008/0057620 | A1* | 3/2008 | Pratt | H01L 24/16 438/106 |
| 2013/0178062 | A1* | 7/2013 | Enquist | H01L 24/24 438/667 |
| 2013/0270328 | A1* | 10/2013 | Di Cioccio | H01L 24/05 228/205 |
| 2014/0145338 | A1 | 5/2014 | Fujii et al. | |
| 2015/0076649 | A1 | 3/2015 | Kim et al. | |
| 2015/0108644 | A1* | 4/2015 | Kuang | H01L 25/50 257/777 |
| 2015/0262976 | A1* | 9/2015 | Edelstein | H01L 24/80 438/107 |
| 2015/0380395 | A1* | 12/2015 | Marion | H01L 24/83 438/108 |
| 2016/0013099 | A1* | 1/2016 | Tanida | H01L 24/08 438/107 |
| 2016/0141282 | A1 | 5/2016 | Jang et al. | |
| 2016/0211248 | A1 | 7/2016 | Yaung et al. | |
| 2016/0343763 | A1 | 11/2016 | Kagawa et al. | |
| 2017/0062366 | A1* | 3/2017 | Enquist | H01L 24/05 |
| 2017/0363606 | A1 | 12/2017 | Kikitsu et al. | |
| 2018/0138223 | A1* | 5/2018 | Kotoo | H01L 25/07 |
| 2019/0157334 | A1 | 5/2019 | Wei et al. | |

FOREIGN PATENT DOCUMENTS

| | | | | |
|---|---|---|---|---|
| CN | 104576637 A | 4/2015 | | |
| CN | 105575890 A | 5/2016 | | |
| JP | 2012015277 A | 1/2012 | | |
| KR | 20060077173 A | 7/2006 | | |
| KR | 20140008983 A | 1/2014 | | |
| WO | WO-2016185883 A1 * | 11/2016 | | G06F 30/39 |
| WO | WO 2016190059 A1 | 12/2016 | | |

* cited by examiner

ANCHOR STRUCTURES AND METHODS FOR UNIFORM WAFER PLANARIZATION AND BONDING

CROSS-REFERENCE TO RELATED APPLICATIONS

This application is a continuation of U.S. patent application Ser. No. 17/504,308, titled "Anchor Structures and Methods for Uniform Wafer Planarization and Bonding," filed Oct. 18, 2021, which is a divisional of U.S. patent application Ser. No. 16/055,758, titled "Anchor Structures and Methods for Uniform Wafer Planarization and Bonding," filed Aug. 6, 2018, which claims the benefit of U.S. Provisional Patent Application No. 62/589,463, titled "Anchor Structures and Methods for Uniform Wafer Planarization and Bonding," filed Nov. 21, 2017, each of which is incorporated herein by reference in its entirety.

BACKGROUND

Semiconductor image sensor devices are used to sense radiation, such as light. Complementary metal-oxide-semiconductor (CMOS) image sensors (CIS) and charge-coupled device (CCD) sensors are used in various applications, such as digital still camera and mobile phone camera applications. These devices utilize an array of pixels (which can include photodiodes and transistors) in a substrate to absorb (e.g., sense) radiation that is projected toward the substrate and convert the sensed radiation into electrical signals.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
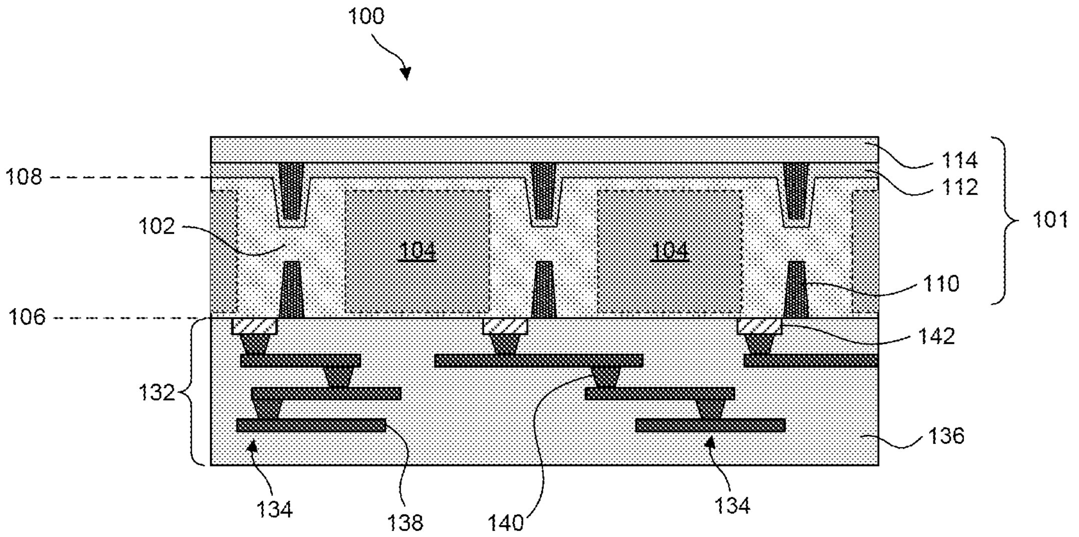
FIG. 1 is a cross-sectional view of a backside illuminated image sensor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

Integrated circuit (IC) packaging has evolved such that multiple dies can be vertically stacked in order to save horizontal device space and increase device density. Vertically stacking multiple dies also provides the benefit of manufacturing each die separately prior to stacking to allow for fabrication flexibility. For example, dies with different thermal budgets can be fabricated separately under different temperature conditions and then stacked together. Prior to stacking, a contact surface of each die is planarized and dies are bonded at these contact surfaces using suitable bonding technologies such as, for example, fusion bonding, hybrid bonding, anodic bonding, direct bonding, room temperature bonding, pressure bonding, and/or combinations thereof. Substantially planar contact surfaces are essential to achieve a strong bond between the stacked dies. When the planarization process is performed on a surface of a die, portions of the substrate surface may 'dish' and form a concave surface or protrude and form a convex surface due to device density and/or different material selectivity (e.g., material removal rate) of the planarization process. When the planar surfaces of two dies are subsequently joined, the concave or convex surfaces come together to form one or more bubbles or voids at the interface of the two dies. The bubbles or voids structurally weaken stacked devices and cause defects that can lead to device failure. Therefore, uniform and planar bonding interface surfaces are important for achieving high yield of semiconductor devices.

Semiconductor image sensor devices are examples of semiconductor devices that can be formed by vertically stacking multiple dies. Image sensor devices are used to sense electromagnetic radiation, such as light (e.g., visible light). Complementary metal-oxide-semiconductor (CMOS) image sensors (CIS) and charge-coupled device (CCD) sensors can be used in various applications, such as digital still camera and mobile phone camera applications. These devices utilize an array of pixels (which can include photodiodes and transistors) in a substrate to absorb (e.g., sense) radiation that is projected toward the substrate. The absorbed radiation can be converted by the photodiodes (in the pixel) into electrical signals, such as charge or current, that can be further analyzed and/or processed by other modules of the image sensor device.

An image sensor device includes a silicon substrate or semiconductor material layer in which light-sensing pixels or photodetectors are formed. Image sensors include an array of photodetectors arranged within a semiconductor substrate that overlies an interconnect structure. Interconnection structures or redistribution structures are formed in image sensor devices to provide electrical power or signal connection to the image sensor devices, and are used interchangeably in the present disclosure. Examples of interconnection structures can be pad structures that are arranged in peripheral openings of the semiconductor structure and laterally adjacent to the photodetectors. Interconnection structures are formed in dielectric layers such as silicon oxide or silicon nitride that are formed on the silicon substrate or semiconductor material layer.

Image sensor devices can be manufactured by stacking a plurality of integrated chip die on top of one another. The plurality of integrated chip die can be separately manufactured by forming one or more metallization layers within ILD layers over separate semiconductor substrates. One or more redistribution layers can then be formed within the ILD layers over the metallization layers. A planarization process (e.g., a chemical mechanical polishing process) can be performed to form a planar surface that includes the redistribution layers and the ILD layer. The planar surfaces of the separate integrated chip die can then be brought together and bonded so that the redistribution layers of the separate integrated chip die are joined.

When the planarization process is performed on the separate integrated die, portions of the substrate surface may 'dish' and form a concave surface that drops below the surrounding ILD layer. In some embodiments, portions of the substrate surface can protrude from the surrounding ILD layer. When the planar surfaces of two integrated chip die are subsequently joined, the concave or protruding surfaces come together to form one or more bubbles or voids at the interface of the two integrated die. The bubbles or voids structurally weaken the image sensor device structure, such that if a force used to form a bonding structure is too large, the structure underlying the bond pad may crack and damage the multi-dimensional integrated chip. Therefore, uniform and planar bonding interface surfaces are important for achieving high yield of image sensor devices.

The present disclosure describes anchor structures and methods for forming anchors structures, which promote uniformity in the planarization and wafer bonding processes. Such uniformity reduces device defects and provides reliable electrical connections between IC dies. The anchor structures and methods for forming anchor structures described in the present disclosure can be applied to any suitable semiconductor device where multiple devices are planarized and bonded together. Anchor structures can include (i) thin anchor layers (e.g., anchor layers having thickness between 200 Å and 2000 Å) on a dielectric layer surface and (ii) anchor pads in the anchor layers and on the dielectric layer surface. Interconnect structures can be formed in the dielectric layer and also through the anchor layers. A planarization process can be performed on top surfaces of the anchor layer, the interconnect structure, and the anchor pads such that the surfaces are coplanar. The anchor layers can be formed on (e.g., directly on) a top surface of an ILD layer. The anchor layers can provide uniform planarization because the anchor layer material can be selected such that the planarization selectivity of the anchor layer material and an interconnection material are substantially the same. Anchor pad material can be selected such that it promotes wafer bonding between the IC dies.

Planarization uniformity can also be affected by the pattern density of structures formed on the surface to be planarized. Image sensor devices can have different pattern densities across the device structure. Some regions on the image sensor device can include areas with greater relative pattern density (e.g., more device structures per unit area), while some regions on the image sensor device can include areas with lower relative pattern density (e.g., fewer device structures per unit area). However, it should be noted that any relative comparison of "more" and "fewer" is within the scope of the present disclosure. To provide uniform pattern density, anchor pads are formed in the anchor layers and on the dielectric layer to provide uniform density of structures (e.g., substantially the same device structures per unit area) that have the same or similar material. For example, anchor pads can be formed from the same or substantially similar material as interconnect or redistribution structures and thus have the same or similar planarization selectivity as the interconnect material. For example, the interconnection metal and anchor pad material can include any conducting material, including transparent indium tin oxide, zinc oxide, any other suitable materials, or any combination thereof. Materials that form the anchor pads can be metal or adhesion materials. The anchor pad can have a passive device function or can be electrically connected to passive/active devices. The anchor pad can be embedded in the anchor layer and can have substantially the same thickness as the anchor layer. As the anchor layer has a small thickness the anchor pad also provides a benefit of occupying little device space, thus improving device density in image sensor devices.

Before describing the embodiments related to anchor layer and anchor pad structures in an image sensing device, a back side illuminated image sensor device illustrating a pixel region of the image sensing device is discussed in FIG. 1. The back side illuminated image sensor device shown in FIG. 1 can be formed by planarizing and stacking multiple dies such as a radiation sensing die and an interconnect die.

FIG. 1 is a simplified cross-sectional view of a back side illuminated image sensor device 100, according to some embodiments of the present disclosure. Back side illuminated image sensor device 100 includes a radiation-sensing structure 101 stacked on an interconnect structure 132. Radiation-sensing structure 101 and interconnect structure 132 can be fabricated separately before being bonded together to form back side illuminated image sensor device 100.

Radiation-sensing structure 101 includes a semiconductor layer 102 with radiation-sensing areas 104. By way of example and not limitation, semiconductor layer 102 includes a silicon material with a p-type dopant, such as boron. Alternatively, semiconductor layer 102 can include silicon with an n-type dopant, such as phosphorous or arsenic. Semiconductor layer 102 can also include other elementary semiconductors, such as germanium or diamond. Semiconductor layer 102 can optionally include a compound semiconductor and/or an alloy semiconductor. Further, semiconductor layer 102 can include an epitaxial layer, which may be strained for performance enhancement. Semiconductor layer 102 can include a silicon-on-insulator (SOI) structure.

Semiconductor layer 102 has a front side 106 (also referred to herein as a "bottom surface") and a back side 108 (also referred to herein as a "top surface"). Semiconductor layer 102 has a thickness that can range from about 100 μm to about 3000 μm. Radiation-sensing structure 101 can be prepared for bonding by performing a planarization process (e.g., a CMP process) on front surface 106 such that it is substantially planar.

Radiation-sensing regions or pixels 104 are formed in the semiconductor layer 102. As disclosed herein, the terms "radiation-sensing regions" and "pixels" may be used interchangeably. Pixels 104 are configured to sense radiation, such as incident light rays impinging semiconductor layer 102 from a back side 108. Each of the radiation-sensing regions or pixels 104 includes a photodiode that can convert photons to charge, according to some embodiments of the present disclosure. In some embodiments of the present disclosure, pixels 104 can include photodiodes, transistors, amplifiers, other similar devices, or combinations thereof. Pixels 104 is also be referred to herein as "radiation-detection devices" or "light-sensors."

For simplicity, two pixels 104 are illustrated in FIG. 1, but additional pixels 104 can be implemented in semiconductor layer 102. By way of example and not limitation, pixels 104 can be formed using an ion implant process on semiconductor layer 102 from a front side 106. Pixels 104 can also be formed by a dopant diffusion process.

Pixels 104 are electrically isolated from each other with shallow trench isolation (STI) structures 110. STI structures 110 are trenches etched into semiconductor layer 102 and filled with a dielectric material, such as silicon oxide, silicon nitride, silicon oxynitride, fluorine-doped silicate glass (FSG), a low-k dielectric material (e.g., a material with a k value lower than 3.9), any other suitable insulating material, or any combination thereof. According to some embodiments of the present disclosure, STI structures 110 on back side 108 of semiconductor layer 102 have an anti-reflective coating (ARC) 112. ARC 112 is a liner layer that can prevent incoming light rays from being reflected away from radiation-sensing areas/pixels 104. ARC 112 can include a high-k material (e.g., a material with a k-value higher than 3.9), such as hafnium oxide ($HfO_2$), tantalum pentoxide ($Ta_2O_5$), zirconium dioxide ($ZrO_2$), aluminum oxide ($Al_2O_3$), or any other high-k material. ARC 112 can be deposited using a sputtering process, a chemical vapor deposition (CVD)-based process, an atomic layer deposition (ALD)-based technique, or any other suitable deposition technique. In some embodiments of the present disclosure, the thickness of ARC 112 can range from about 10 Å to about 500 Å (e.g., 10 Å to 500 Å).

Back side illuminated image sensor device 100 also includes a capping layer 114 formed over semiconductor layer 102, such as over ARC 112, as illustrated in FIG. 1. In some embodiments of the present disclosure, capping layer 114 can provide a planar surface on which additional layers of back side illuminated image sensor device 100 can be formed. Capping layer 114 can include a dielectric material, such as silicon oxide ($SiO_2$), silicon nitride ($Si_3N_4$), silicon oxy-nitride (SiON), or any other suitable dielectric material. Further, capping layer 114 can be deposited using CVD or any other suitable deposition technique. In some embodiments of the present disclosure, the thickness of capping layer 114 can range between about 500 Å and about 2000 Å (e.g., 500 Å to 2000 Å). Further, back side illuminated image sensor device can include a composite grid structure (not shown in FIG. 1 for simplicity) formed over capping layer 114. Composite grid structure can further include cells arranged in columns and rows, where each cell is aligned to a respective radiation-sensing area. The cells can receive a red, green, or blue color filter.

An interconnect structure 132 can be bonded to radiation sensing structure 101 to form a stacked device. Interconnect structure 132 is bonded to radiation-sensing structure 101 at front surface 106 of semiconductor layer 102. Interconnect structure 132 can include patterned dielectric layers and conductive layers that form interconnects (e.g., wiring) between pixels 104 and other components that are not shown in FIG. 1 for simplicity. Interconnect structure 132 may be, for example, one or more multilayer interconnect (MLI) structures 134 embedded in an interlayer dielectric (ILD) layer 136. According to some embodiments of the present disclosure, MLI structures 134 can include contacts/vias and metal lines. For purposes of illustration, multiple conductive lines 138 and vias/contacts 140 are shown in FIG. 1. The position and configuration of conductive lines 138 and vias/contacts 140 can vary depending on design needs and are not limited to the depiction in FIG. 1. Further, interconnect structure 132 can include sensing devices 142. Sensing devices 142 can be, for example, an array of field effect transistors (FETs) and/or memory cells that are electrically connected to respective radiation-sensing areas (or pixels) 104 and configured to detect electrical signals generated in those areas as a result of a light-to-charge conversion process.

Figure 2:
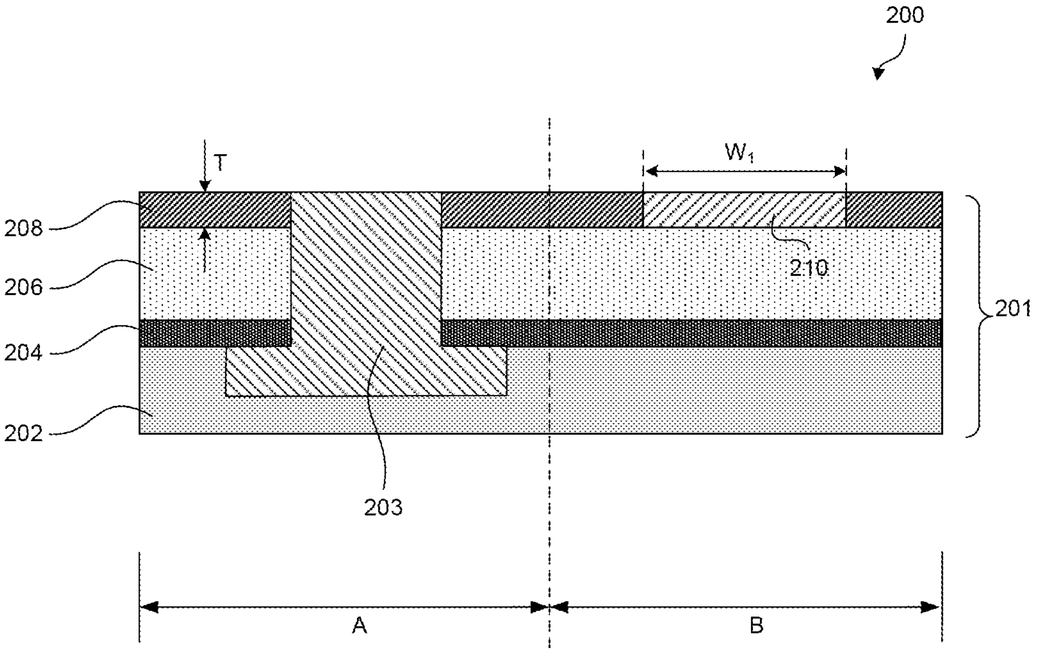
FIG. 2 is a cross-sectional view of an image sensor device, according to some embodiments.

FIG. 2 is a cross-sectional view of image sensor device 200 incorporating anchor layer and anchor pad structures, according to some embodiments. Image sensor device 200 can include a die (e.g., chip) 201. Die 201 includes a substrate 202, a redistribution structure 203, an etch stop layer 204, an interlayer dielectric layer (ILD) 206, an anchor layer 208, and an anchor pad 210. Image sensor device 200 can include additional structures, such as other dielectric layers, conductive interconnect structures, and light sensors (not shown in FIG. 2 for clarity and simplicity). Die 201 can include a redistribution region A that includes redistribution structures and a pixel region B that includes one or more radiation-sensing areas or pixel structures.

Substrate 202 can be a p-type substrate, such as a silicon material doped with a p-type dopant (e.g., boron). In some embodiments, substrate 202 can be an n-type substrate, such as a silicon material doped with an n-type dopant (e.g., phosphorous or arsenic). In some embodiments, substrate 202 can include, germanium, diamond, a compound semiconductor, an alloy semiconductor, a silicon-on-insulator (SOI) structure, any other suitable material, or combinations thereof. Substrate 202 can have an initial thickness in a range from about 100 μm to about 3000 μm (e.g., 100 μm to 3000 μm). Substrate 202 can be a sensor device, application-specific integrated circuit (ASIC), field programmable gate array (FPGA), memory device, microelectromechanical system (MEMS), any suitable device, or any combination thereof.

Etch stop layer 204 can be used in the formation of a redistribution area. Etch stop layer 204 can include a dielectric material, such as silicon nitride. In some embodiments, etch stop layer can include silicon oxide, spin-on-glass, silicon oxynitride, fluorine-doped silicate glass (FSG), a low-k dielectric material, any other suitable insulating material, or combinations thereof. Etch stop layer 204 can be formed by a depositing an etch stop layer material using any suitable deposition methods, such as chemical vapor deposition (CVD), plasma-enhanced CVD (PECVD), atomic layer deposition (ALD), physical vapor deposition (PVD), flowable CVD (FCVD), any other suitable process, or combinations thereof.

Interlayer dielectric (ILD) layer 206 is disposed on etch stop layer 204. ILD layer 206 can include a dielectric material, such as silicon oxide. Conductive layers and structures that provide interconnections (e.g., wiring) between various doped features, circuitry, and input/output of the image sensor device 200 can be embedded in ILD layer 206. The conductive layers and structures can be portions of a multilayer interconnect (MLI) structure that includes contacts, vias, and/or metal lines.

Anchor layer 208 is disposed on ILD layer 206. Anchor layer 208 can provide uniform planarization because its material has substantially the same planarization selectivity as that of the interconnection material or redistribution structure material. In some embodiments, anchor layer 208 can include a material that promotes wafer-to-wafer bonding. In some embodiments, anchor layer 208 can include an adhesive material. In some embodiments, the material of anchor layer 208 can be a compound that includes silicon, oxygen, fluoride, carbon, and nitride ($SiO_xF_yC_zN_a$), polymer, resin, low-k dielectric, high-k dielectric, insulating layers, any other suitable material, or combinations thereof. An ultra-violet light curing process can be used to form anchor layer 208. Anchor layer 208 can also provide the benefit of preventing copper diffusion between redistribution structures, anchor pads, and other structures of image sensor device 200. Anchor layer 208 can be formed by a depositing an etch stop layer material using any suitable deposition method, such as chemical vapor deposition (CVD), plasma-enhanced CVD (PECVD), atomic layer deposition (ALD), physical vapor deposition (PVD), flowable CVD (FCVD), any other suitable process, or combinations thereof. In referring to FIG. 2, a thickness T of anchor layer 208 can be between about 200 Å and about 2000 Å (e.g., 200 Å to 2000 Å). In some embodiments, the thickness T of anchor layer 208 can be between about 400 Å and about 1200 Å (e.g., 400 Å to 1200 Å). In some embodiments, the thickness T of anchor layer 208 can be about 800 Å. In some embodiments, the thickness T of anchor layer 208 can be about 750 Å.

Redistribution structure 203 is formed in redistribution region A of image sensor device 200. Redistribution structure 203 can be an interconnect structure configured to provide electrical connection between metal lines in different tiers of the image sensor structure and/or between image sensor device 200 and subsequently bonded structures thereto. A bottom portion of redistribution structure 203 can be formed in substrate 202. The bottom portion can be formed by forming a trench in substrate 202 and depositing a conductive material in the formed trench. Redistribution structure 203 can extend vertically through etch stop layer 204, ILD layer 206, and anchor layer 208, and be exposed at the top surface of image sensor device 200. In some embodiments, redistribution structure can include a conductive material, such as copper, aluminum, tungsten, silver, titanium, any other suitable conductive material or alloys thereof, or combinations thereof. In some embodiments, redistribution structure 203 can be formed using transparent indium tin oxide, zinc oxide, or any other suitable material. Redistribution structure 203 can be a single damascene structure, a dual damascene structure, or any other suitable structure.

Redistribution structure 203 can be fabricated using suitable processes, including patterning and etch processes. The patterning process can include forming a photoresist layer overlying anchor layer 208, exposing the photoresist layer to a pattern, performing post-exposure bake processes, and developing the photoresist layer to form a masking element including the resist. The masking element can protect regions of anchor layer 208, while etch processes are used to form an opening in anchor layer 208 and underlying layers. The etching process can be a reactive ion etch (RIE) process and/or other suitable process. The etching process can continue until substrate 202 is exposed or continue into substrate 202 for a nominal depth. After an opening is formed, conductive metal such as the materials described above can be deposited into the opening using any suitable process. Other methods to form redistribution structure 203 in image sensor device 200 may be suitable. The width of redistribution structure 203 can be in a range of about 0.01 μm to about 200 μm (e.g., 0.01 μm to 200 μm).

Anchor pads 210 can be formed in the pixel region B of image sensor 200. Only one anchor pad is illustrated in FIG. 2, and more anchor pads are omitted for simplicity. As planarization uniformity is affected by pattern density, such as the pattern density of the interconnect structures, anchor pads are used in image sensor devices to provide uniform pattern density of metallic structures, which in turn provides planarization uniformity. To provide uniform pattern density, anchor pads are formed of the same or similar material in anchor layer 208 and on ILD layer 206. For example, anchor pads can be formed using a material that is the same or substantially similar to the material used to form redistribution structure 203. Anchor pads can have a rectangular conductive structure. In some embodiments, the anchor pads can be solid conductive structures. In some embodiments, the anchor pads can be hollow structures. In some embodiments, the anchor pads can have conductive metal slot structures.

The anchor pad material can have the same or similar planarization selectivity as the redistribution structure material. For example, the redistribution structure metal and anchor pad material can include any conducting material, such as transparent indium tin oxide, zinc oxide, any other suitable material, or any combination thereof. Materials that form the anchor pads can be metal or adhesion materials. Examples of adhesion materials include polymer, conducting adhesion materials, any other suitable materials, or any combination thereof. Anchor pads can be formed by patterning the anchor layer to form openings and depositing an anchor pad material into the openings. The patterning process can include forming a photoresist layer overlying anchor layer 208, exposing the photoresist layer to a pattern, performing post-exposure bake processes, and developing the photoresist layer to form a masking element including the resist. The masking element can protect regions of anchor layer 208, while etch processes are used to form an opening in anchor layer 208 and underlying layers. The etching process can be a reactive ion etch (RIE) process and/or other suitable process. The etching process can continue until substrate dielectric layer 206 is exposed or continue into dielectric layer 206 for a nominal depth. After an opening is formed, anchor pad material such as the materials described above can be deposited into the opening using any suitable deposition methods, such as chemical vapor deposition (CVD), plasma-enhanced CVD (PECVD), atomic layer deposition (ALD), physical vapor deposition (PVD), flowable CVD (FCVD), any other suitable process, or combinations thereof.

The anchor pad can also have a passive device function or be electrically connected to passive/active devices. The anchor pad width can be in a range between about 0.01 μm and about 200 μm (e.g., 0.01 μm to 200 μm). In some embodiments, the anchor pad can have a thickness similar to the thickness of anchor layer 208. In some embodiments, the anchor pad can extend vertically into ILD layer 206. In some embodiments, the anchor pad thickness can be between 100 Å and 7000 Å. The anchor pad width $W_1$ can also be substantially similar to the width of redistribution structure 203. The width of anchor pads can be in a range of 0.01 μm to about 200 μm. The anchor pad thickness can be less than the thickness of the interconnect structure. A pitch separation between redistribution structure 203 and anchor pads can be in a range between about 0.1 μm and about 100 μm (e.g., 0.1 μm and 100 μm). The pitch separation between adjacent anchor pads can be in a range between about 0.1 μm and about 100 μm (e.g., 0.1 μm and 100 μm).

After the above structures are formed, a planarization process, such as CMP, can be used to planarize the top surfaces of redistribution structure 203, anchor layer 208, and anchor pads 210. Because anchor pads can include a material that has the same or similar planarization selectivity as the interconnect material and the anchor layer, the planarization speed can be similar across the top surfaces which results in a substantially planar surface. In addition, anchor pads formed in the anchor layer and on the dielectric layer provide uniform pattern density of structures that have the same or similar material which can also promote uniform planarization.

Figure 3:
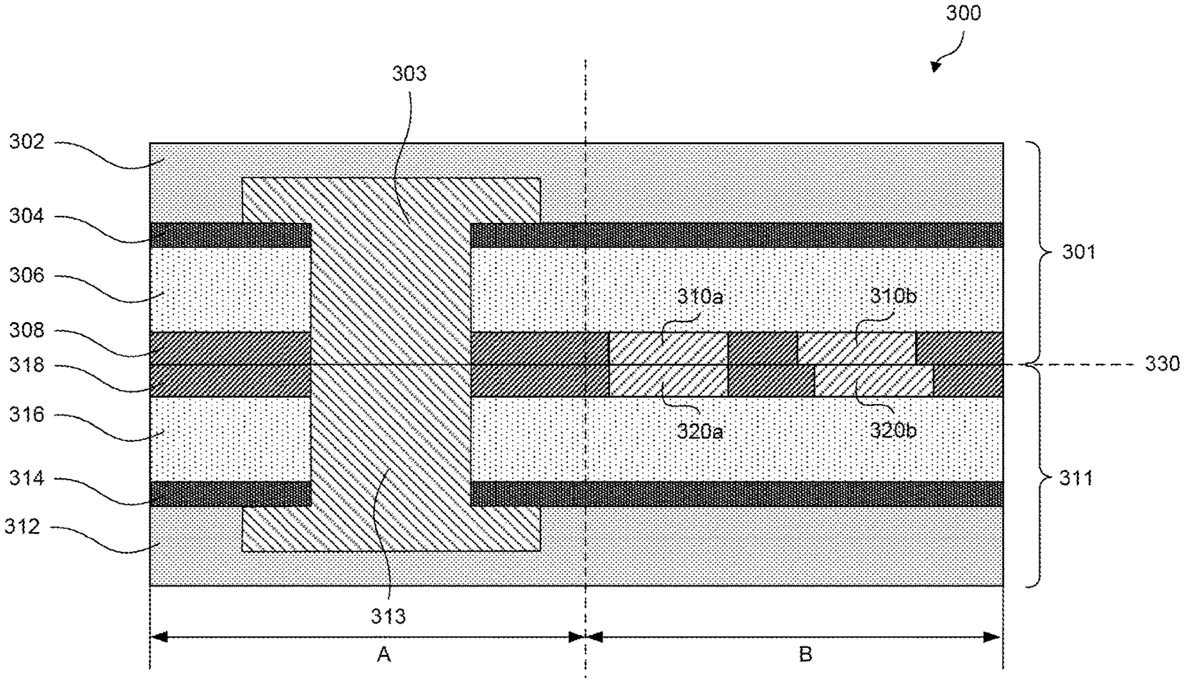
FIG. 3 is a cross-sectional view of an image sensor device, according to some embodiments.

FIG. 3 is a cross-sectional view of image sensor device 300 incorporating anchor layer and anchor pad structures, according to some embodiments. Image sensor device 300 can include a first die (e.g., chip) 301 bonded to a second die 311 at a bonding interface 330. First and second dies 301 and 311 respectively include substrates 302 and 312, redistribution structures 303 and 313, etch stop layers 304 and 314, ILD layers 306 and 316, anchor layers 308 and 318, anchor pads 310*a*, 310*b* and 320*a* and 320*b*. Image sensor device 300 can include additional structures, such as other dielectric layers, conductive interconnect structures, and light sensors (not shown in FIG. 3 for clarity and simplicity). Each die can include a redistribution region A with redistribution structures and a pixel region B with pixel structures.

Substrates 302 and 312 can each be a p-type substrate, such as, a silicon material doped with a p-type dopant (e.g., boron). In some embodiments, substrates 302 and 312 can each be an n-type substrate, a silicon material doped with an n-type dopant (e.g., phosphorous or arsenic). Substrates 302 and 312 can be similar to the substrate 202 described above in FIG. 2 and is not described here in detail. Substrates 302 and 312 can have an initial thickness in a range from about 100 μm to about 3000 μm.

Etch stop layers 304 and 314 can be used in the formation of a subsequent redistribution area formation. Etch stop layers 304 and 314 can include a dielectric material, such as silicon nitride. In some embodiments, etch stop layers 304 and 314 can be formed using materials similar to etch stop layer 204 described above in FIG. 2. Etch stop layers 304 and 314 can be deposited using any suitable deposition methods such as, for example, CVD, PECVD, ALD, PVD, FCVD, any other suitable process, or combinations thereof.

ILD layers 306 and 316 are disposed on etch stop layers 304 and 314, respectively. ILD layers 306 and 316 can include a dielectric material, such as silicon oxide. In some embodiments, ILD layers 306 and 316 can include materials similar to the materials that form ILD layer 206 described above in FIG. 2. ILD layers 306 and 316 can be deposited using any suitable deposition methods such as, for example, CVD, PECVD, ALD, PVD, FCVD, any other suitable process, or combinations thereof.

Anchor layers 308 and 318 are disposed on ILD layers 306 and 316, respectively. As described above, anchor layers can be formed in pixel region B and provide uniform planarization because its material has substantially the same planarization selectivity as the anchor layer material and the interconnection material or redistribution structure material. In some embodiments, anchor layers 308 and 318 can include a material that promotes wafer-to-wafer bonding. In some embodiments, anchor layers 308 and 318 can include an adhesive material. Anchor layers 308 and 318 can be formed using materials and processes similar to anchor layer 208 described above in FIG. 2. Anchor layers can also prevent copper diffusion between redistribution structures, anchor pads, and other structures of the image sensor device. Anchor layers 308 and 318 can be deposited using any suitable deposition methods such as, for example, CVD, PECVD, ALD, PVD, FCVD, any other suitable process, or combinations thereof.

In some embodiments, material of anchor layers 308 and 318 can be a compound that includes silicon, oxygen, fluoride, carbon, and nitride ($SiO_xF_yC_zN_a$), polymer, resin, low-k dielectric, high-k dielectric, insulating layers, or any other suitable material. For example, anchor layer can include silicon oxynitride. An ultra-violet light curing process can be used to form anchor layers 308 and 318. Thicknesses of anchor layers 308 and 318 can be between about 200 Å and about 2000 Å (e.g., 200 Å to 2000 Å). In some embodiments, a thickness T of anchor layers 308 and 318 can be between about 400 Å and about 1200 Å (e.g., 400 Å to 1200 Å). In some embodiments, the thickness T of anchor layers 308 and 318 can be about 800 Å. In some embodiments, the thickness T of anchor layers 308 and 318 can be about 750 Å. In some embodiments, anchor layers 308 and 318 can have different thicknesses. In some embodiments, anchor layers 308 and 318 can have the same or substantially the same thickness.

Redistribution structures 303 and 313 are formed in image sensor device 300 in redistribution region A. Redistribution structures 303 and 313 can be interconnect structures configured to provide electrical connections between metal lines in different tiers of the image sensor structure and/or also between die 301 and die 311. Redistribution structures 303 and 313 can respectively extend vertically through etch stop layers 304 and 314, ILD layers 306 and 316, and anchor layers 308 and 318. In some embodiments, redistribution structures 303 and 313 can include conductive materials, such as copper, aluminum, tungsten, silver, titanium, any other suitable conductive material or alloys thereof, or combinations thereof. In some embodiments, redistribution structures 303 and 313 can be formed using transparent indium tin oxide, zinc oxide. In some embodiments, redistribution structures 303 and 313 can be formed using similar material and processes of redistribution structure 203 described above in FIG. 2. The width of redistribution structures 303 and 313 can be in a range of 0.01 μm to about 200 μm. In some embodiments, the widths of redistribution structures 303 and 313 can be the same or substantially the same. In some embodiments, the widths of redistribution structures 303 and 313 can be different. Redistribution structures 303 and 313 can be formed through any number of suitable techniques, including PVD, CVD, electrochemical deposition (ECD), molecular beam epitaxy (MBE), ALD, electroplating, and the like. For example, redistribution structures 303 and 313 can be formed of copper, nickel, platinum, gold, silver, or combinations thereof.

Anchor pads 310*a*-310*b* and 320*a*-320*b* can be formed in the pixel region B of image sensor 300. Anchor pads 310*a*-310*b* and 320*a*-320*b* are respectively formed in anchor layers 308 and 318 and on ILD layers 306 and 316 to provide uniform density of structures that have the same or similar material. Anchor pads 310*a*-310*b* and 320*a*-320*b* can be formed using a similar material as anchor pad 210 described above in FIG. 2. For example, anchor pads 310*a*-310*b* and 320*a*-320*b* can be formed using material that is the same or substantially similar to the material used to form redistribution structures 303 and 313. The anchor pad material can have the same or similar planarization selectivity as the redistribution structure material. For example, the redistribution structure material and anchor pad material can be any conducting material, including transparent indium tin oxide, zinc oxide, any other suitable material, or any combination thereof. Materials that form the anchor pads can be metal or adhesion materials. Examples of adhesion materials can be polymers, conducting adhesion materials, any other suitable material, or any combination thereof. Anchor pads 310*a*-310*b* and 320*a*-320*b* can be formed by forming openings in anchor layer 308 and 318, respectively. In some embodiments, a patterning process of the anchor layer can include photolithography and etch processes. The photolithography process can include forming a photoresist layer overlying anchor layers 308 and 318, exposing the resist to a pattern, performing post-exposure bake processes, and developing the resist to form a masking element including the resist. The masking element can then be used to protect regions of anchor layers 308 and 318 while an etch process removes exposed anchor layer material and forms openings. The etch process can be a reactive ion etch (RIE) or any other suitable process. After the openings are formed, anchor pads 310*a*-310*b* and 320*a*-320*b* can be formed through any number of suitable techniques, including CVD, PECVD, ALD, PVD, FCVD, ECD, MBE, electroplating, and the like.

Anchor pads 310*a*-310*b* and 320*a*-320*b* can also have a passive device function or be electrically connected to passive/active devices. The width of anchor pads 310*a*-310*b* and 320*a*-320*b* can be in a range between about 0.01 μm and about 200 μm. The width of anchor pads 310*a*-310*b* and 320*a*-320*b* can also be substantially similar to the width of redistribution structure 203. In some embodiments, anchor pads 310*a*-310*b* and 320*a*-320*b* can each have a thickness similar to the thickness of anchor layers 308 and 318. The anchor pad thickness can be less than the thickness of the interconnect structure. In some embodiments, anchor pads 310*a*-310*b* and 320*a*-320*b* can respectively extend vertically into ILD layers 306 and 316. In some embodiments, the thickness of anchor pads 310*a*-310*b* and 320*a*-320*b* can be between 100 Å and 7000 Å. The pitch separation between redistribution structure 303 and anchor pads 310*a*-310*b* and 320*a*-320*b* can be in a range between 0.1 μm and 100 μm. The pitch separation between anchor pads 310*a*-310*b* and 320*a*-320*b* can be in a range between 0.1 μm and 100 μm.

Dies 301 and 311 are wafer bonded together at interface 330, according to some embodiments. Anchor structures and interconnect structures from dies 301 and 311 can be respectively aligned and bonded to each other during the wafer bonding process. Dies 301 and 311 are bonded by a suitable bonding method, such as fusion bonding, hybrid bonding, anodic bonding, direct bonding, room temperature bonding, any other suitable bonding process, or combinations thereof. Because of improved planarization uniformity in the anchor layers and anchor pads, adhesion and boding between dies 301 and 311 reduce or eliminate the formation voids at bonding interface 330. Therefore, electrical connections between redistribution structures 303 and 313 can be reliably formed. In some embodiments, anchor pads from a first die are aligned with anchor pads from a second die. For example, anchor pad 310*a* of die 301 is aligned with anchor pad 320*a* of die 311. In some embodiments, anchor pads from the first die are partially aligned with anchor pads from a second die and still fully maintain their function as if they are aligned, but in addition provide the benefit of an increased margin for alignment and overlay requirements of the photolithography process. For example, anchor pad 310*b* of die 301 and anchor pad 320*b* of die 311 can be partially aligned as shown in FIG. 3.

In some embodiments, during the bonding process, anchor pads from a first die can be parallel with anchor pads from a second die. In some embodiments, the anchor pads from the first and second dies can be perpendicular or formed at an angle between 0° and 90° with one another. In some embodiments, the anchor pads and/or interconnect structures can also be partially aligned and joined after the wafer bonding process, in accordance with some embodiments. FIGS. 4A-4B, 5, and 6, describes various arrangements of anchor pads between a first die and a second die. These figures illustrate example configurations of anchor pads and other structures are omitted for simplicity and clarity. Other suitable structures can also be formed in the structures illustrated in these figures.

Figure 4A:
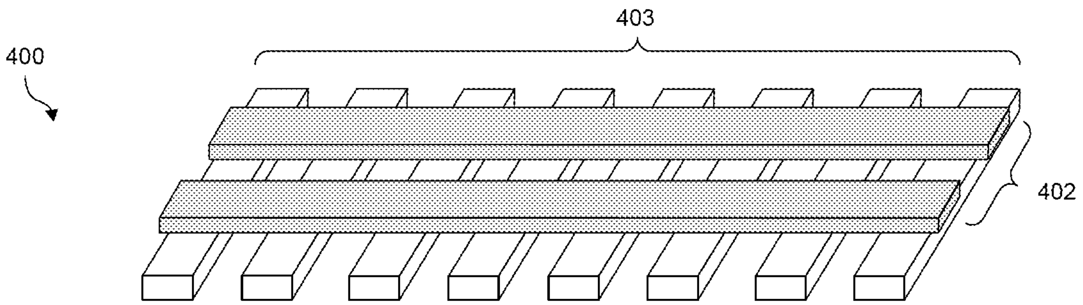
FIGS. 4A-4B are respective isometric and top views of an image sensor device, according to some embodiments.
Figure 4B:
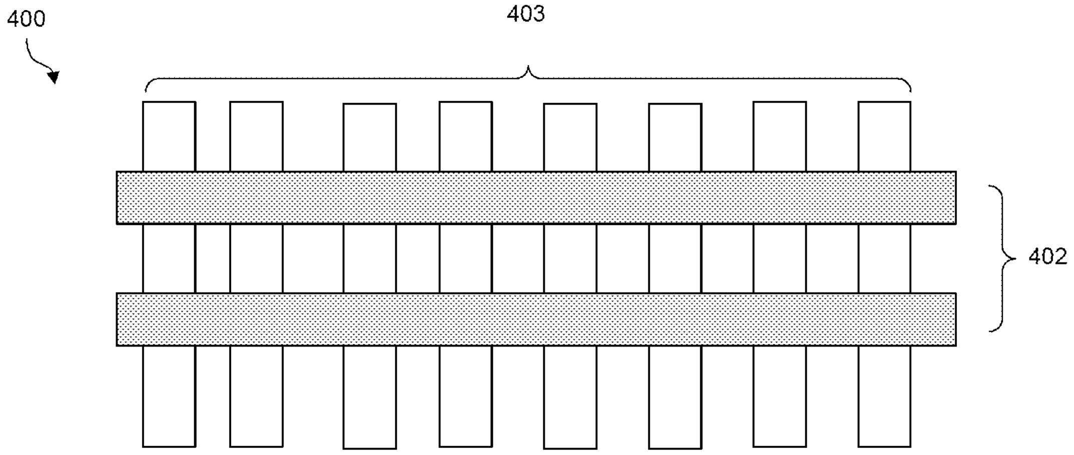

FIGS. 4A-4B are respective isometric and top views of image sensor device 400 that incorporate anchor pad structures formed at an angle with each other. FIGS. 4A-4B include an array of anchor pads 402 from a first die and an array of anchor pads 403 from a second die. As shown in FIG. 4A, array of anchor pads 402 is bonded to array of anchor pads 403. Each anchor pad in the array of anchor pads 402 is substantially perpendicular to an anchor pad in the array of anchor pads 403. In some embodiments, the arrays of anchor pads 402 and 403 can be formed at an angle between about 0° and about 90°. In some embodiments, anchor pads in arrays of anchor pads 402 and 403 can have thickness between 100 Å and 7000 Å. The anchor pad widths can be in a range of 0.01 μm to about 200 μm. The pitch separation between adjacent anchor pads can be in a range between 0.1 μm and 100 μm. Array of anchor pads 402 can have substantially similar dimensions as array of anchor pads 403, according to some embodiments. In some embodiments, anchor pads of the two arrays can have different dimensions.

Figure 5:
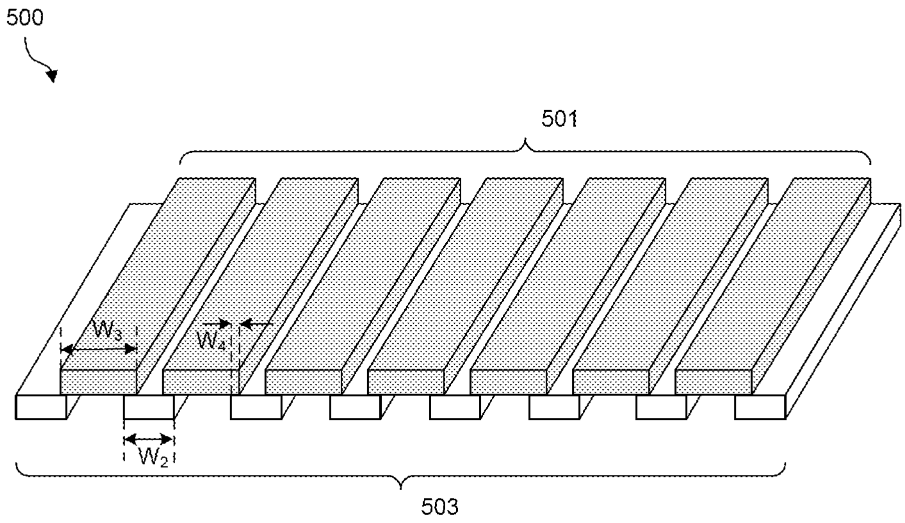
FIG. 5 is an isometric view of an image sensor device, according to some embodiments.

FIG. 5 is an isometric view of image sensor device 500 that incorporates anchor pad structures formed with lateral offsets, in accordance with some embodiments. FIG. 5 includes an array of anchor pads 501 from a first die and an array of anchor pads 503 from a second die. As shown in FIG. 5, array of anchor pads 501 is bonded to array of anchor pads 503. Each anchor pad in the array of anchor pads 501 is substantially parallel to an anchor pad in the array of anchor pads 503. In some embodiments, an anchor pad from one array can be electrically connected to two anchor pads from the other array by forming an overlap area. In some embodiments, the overlap area has width $W_4$ between 0% and 100% of the anchor pad width. In some embodiments, anchor pads in arrays of anchor pads 501 and 503 can have a thickness between 100 Å and 7000 Å. The anchor pad widths $W_2$ and $W_3$ can be in a range of 0.01 μm to about 200 μm. The pitch separation between adjacent anchor pads can be in a range between 0.1 μm and 100 μm. Array of anchor pads 501 can have substantially similar dimensions as array of anchor pads 503. In some embodiments, anchor pads of the two arrays can have different dimensions.

Figure 6:
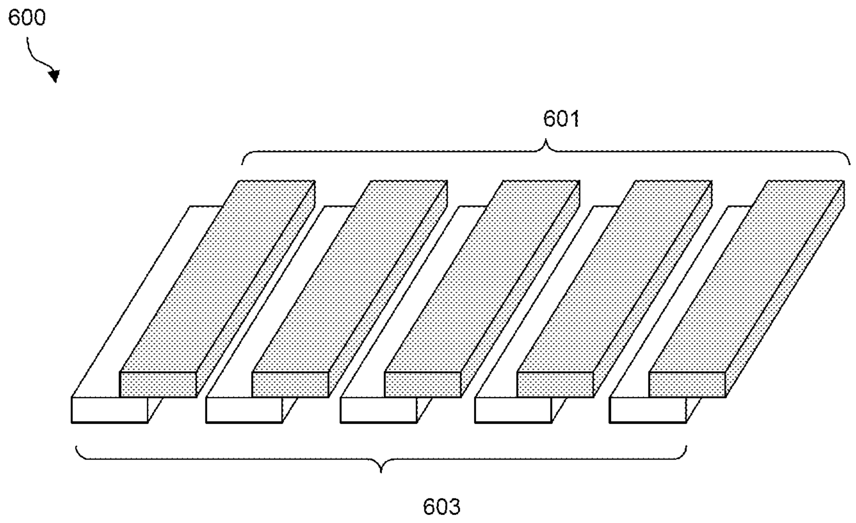
FIG. 6 is an isometric view of an image sensor device, according to some embodiments.

FIG. 6 is an isometric view of image sensor device 600 that incorporates anchor pad structures formed with lateral offsets, in accordance with some embodiments. FIG. 6 includes an array of anchor pads 601 from a first die and an array of anchor pads 603 from a second die. As shown in FIG. 6, an array of anchor pads 601 is bonded to an array of anchor pads 603. Each anchor pad in the array of anchor pads 601 is substantially parallel to an anchor pad in the array of anchor pads 603. In some embodiments, an anchor pad from one array can be electrically connected to an anchor pad from the other array by forming an overlap area. In some embodiments, the overlap area has width between 0% and 100% of the anchor pad width. In some embodiments, anchor pads in arrays of anchor pads 601 and 603 can have a thickness between 100 Å and 7000 Å. The anchor pad widths can be in a range of 0.01 μm to about 200 μm. The pitch separation between adjacent anchor pads can be in a range between 0.1 μm and 100 μm. Array of anchor pads 601 can have substantially similar dimensions as array of anchor pads 603, according to some embodiments. In some embodiments, anchor pads of the two arrays can have different dimensions.

Figure 7:
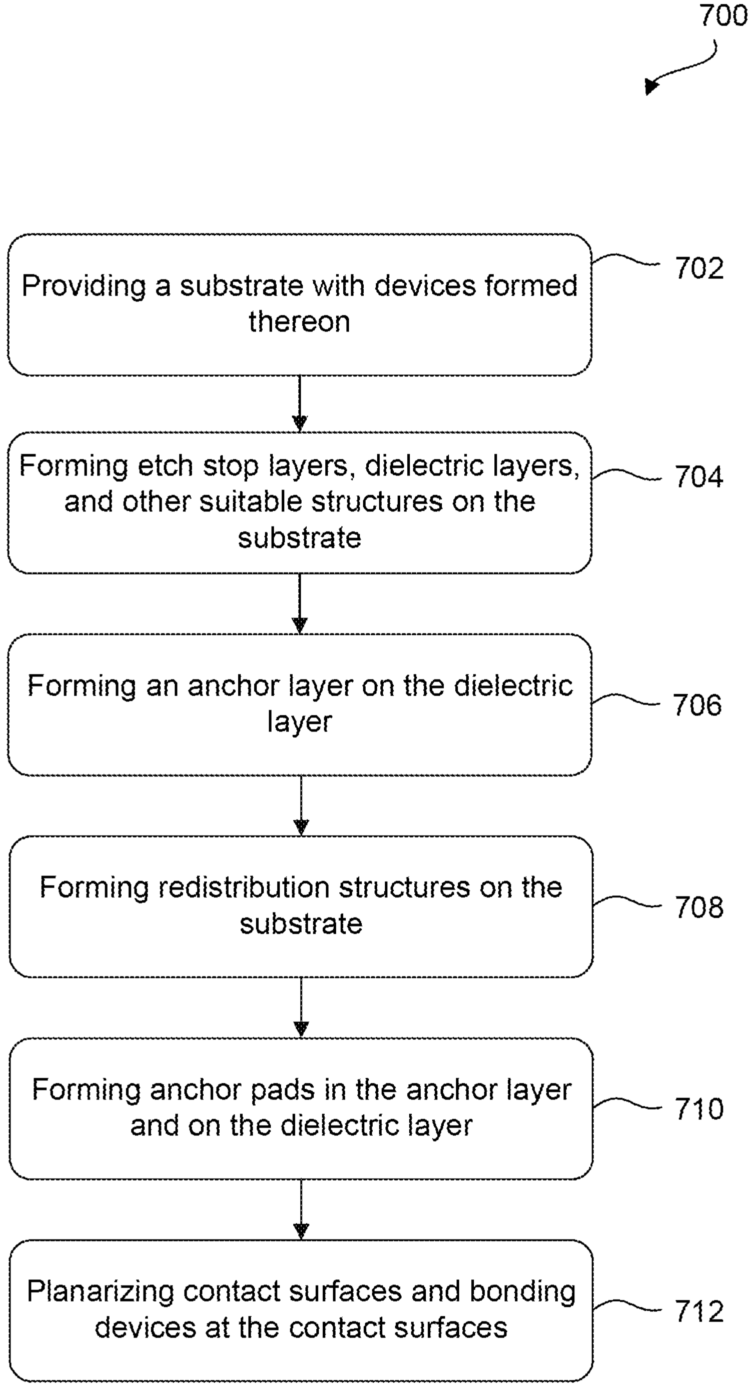
FIG. 7 is a flow diagram of an exemplary method of forming image sensor devices, according to some embodiments.

FIG. 7 is a flow diagram of an exemplary method 700 of forming a stacked semiconductor device with anchor layers and anchor pads, in accordance with some embodiments of the present disclosure. Based on the disclosure herein, operations in method 700 can be performed in a different order and/or vary.

At operation 702, a semiconductor substrate with devices formed thereon is provided, in accordance with some embodiments. Semiconductor devices are formed on and/or within a semiconductor structure. The substrate can be a silicon substrate, according to some embodiments. In some embodiments, the substrate can be (i) another semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, indium antimonide, any other suitable material, or any combination thereof; (iii) an alloy semiconductor including SiGe; or (iv) combinations thereof. In some embodiments, the substrate can be an SOI. In some embodiments, the substrate can be an epitaxial material. In some embodiments, the substrate can also include a processed integrated circuit wafer that includes, for example, a plurality of transistors arranged to be CMOS circuits, RF circuitry, and the like. In some embodiments, active and passive devices—such as transistors, diodes, capacitors, resistors, inductors, and the like—can be formed on and/or within the semiconductor substrate. An example of the substrate can be substrate 202 as described with respect to FIG. 2.

At operation 704, etch stop layers, dielectric layers, and other suitable structures are formed on the substrate, in accordance with some embodiments. The substrate can include any suitable layers/structures, such as etch stop layers, dielectric layers, vias, interconnects, or any suitable structures. The dielectric layer can include a dielectric material, such as silicon oxide, spin-on-glass, SiN, silicon oxynitride, FSG, a low-k dielectric material, any other suitable insulating material, or any combination thereof. Dielectric layer deposition can be done by any suitable process. Examples of etch stop layers can be etch stop layers 204, 304, and 314 described above in FIGS. 2 and 3. Examples of dielectric layers can be ILD layers 206, 306, and 316 described above in FIGS. 2 and 3.

At operation 706, an anchor layer is deposited on the dielectric layer, in accordance with some embodiments. Anchor layers can be disposed on ILD layers and formed in pixel regions to provide uniform planarization. Anchor layers can be formed using material with substantially the same planarization selectivity as the interconnection material or redistribution structure material. In some embodiments, anchor layers can include a material that promotes wafer-to-wafer bonding or an adhesive material. In addition, anchor layers can also prevent copper diffusion between various structures of the image sensor device. Anchor layers can be deposited using any suitable deposition method such as, for example, CVD, PECVD, ALD, PVD, FCVD, any other suitable process, or combinations thereof. Examples of anchor layers can be anchor layers 208, 308, and 318 described above in FIGS. 2 and 3.

At operation 708, redistribution structures are formed on the substrate and extend through the etch stop layer, dielectric layer, and the anchor layer, in accordance with some embodiments. Redistribution structure can be formed in redistribution region of an image sensor device. Redistribution structure can be an interconnect structure configured to provide electrical connection between metal lines in different tiers of the image sensor structure and/or between image sensor devices and subsequently bonded structures. A bottom portion of a redistribution structure can be formed in the substrate by forming a trench in the substrate and depositing a conductive material in the trench. Redistribution structures can extend vertically through the etch stop layer, the ILD layer, and the anchor layer. The redistribution structures can also be exposed at the top surface of the image sensor device. Examples of redistribution structures can be redistribution structures 203, 303, and 313 described above in FIGS. 2 and 3.

At operation 710, anchor pads are formed in the anchor layer and on the dielectric layer, in accordance with some embodiments. Anchor pads can be formed in the pixel region of an image sensor. Anchor pads are formed in anchor layers and on ILD layers to provide a uniform density of structures that have the same or similar material. For example, anchor pads can be formed using material that is the same or substantially similar to the material used to form redistribution structures. The anchor pad material can have the same or similar planarization selectivity as the redistribution structure material. In some embodiments, materials that form the anchor pads can be metal or adhesion materials. In some embodiments, anchor pads can also have a passive device function or be electrically connected to passive/active devices. When dies are aligned and bonded together, anchor structures and interconnect structures from respective dies are aligned and bonded to each other. Because of improved planarization uniformity in the anchor layers and anchor pads, adhesion and bonding between dies reduce or eliminate the formation voids at the bonding interface. Therefore, electrical connections between opposing and bonded redistribution structures can be reliably formed. In some embodiments, anchor pads from a first die are aligned with anchor pads from a second die. In some embodiments, anchor pads from the first die are partially aligned with anchor pads from the second die and still fully maintain their function as if they are aligned, but in addition provide the benefit of an increased margin for alignment and overlay requirements of the photolithography process. In some embodiments, anchor pads from the first die can be in parallel with anchor pads from the second die. In some embodiments, the anchor pads from the first and second dies can be perpendicular or formed at an angle between 0° and 90° with one another. In some embodiments, the anchor pads and/or interconnect structures can also be partially aligned and joined after the wafer bonding process. Examples of anchor pads can be anchor pads 210, 310*a*-310*b*, 320*a*-320*b*, 402, 403, 501, 503, 601, and 603 described above in FIGS. 2-6.

At operation 712, contact surfaces are planarized and devices are bonded at the contact surfaces, in accordance with some embodiments. Anchor pads are formed in the anchor layer and can provide uniform pattern density that enhances planarization uniformity. For example, anchor pads can be formed from the same or substantially similar material as interconnect or redistribution structures and thus have the same or similar planarization selectivity as the interconnect material. In some embodiments, the interconnection metal and anchor pad material can include any suitable conducting material. Materials that form the anchor pads can be metal or adhesion materials. The anchor pad can have a passive device function or can be electrically connected to passive/active devices. The anchor pad can be embedded in the anchor layer and can have substantially the same thickness as the anchor layer. As the anchor layer has a small thickness (e.g., between 100 Å and 7000 Å) the anchor pad also provides a benefit of occupying little device space, thus improving device density in image sensor devices. The anchor layer can be a compound that includes silicon, oxygen, fluoride, carbon, and nitride ($SiO_xF_yC_zN_a$), polymer, resin, low-k dielectric, high-k dielectric, insulating layers, any other suitable material, or combinations thereof. Anchor layers can also provide the benefit of preventing copper diffusion between redistribution structures, anchor pads, and other structures of the image sensor device.

Various embodiments of this disclosure describes anchor structures and methods of forming the anchors structures such that the planarization and wafer bonding process can be uniform, which in turn reduces device defects and provides reliable electrical connections between devices. Anchor structures can include anchor layers formed on a dielectric layer surface and anchor pads formed in the anchor layer and on the dielectric layer surface. Because the interconnect structures are formed in the dielectric layer and through the anchor layer, after the planarization process, the top surfaces of the anchor layer, the interconnect structure, and the anchor pad are coplanar. The anchor layer can provide uniform planarization because the anchor layer material can have substantially the same planarization selectivity as the interconnection material. Anchor pads are formed in the anchor layer and on the dielectric layer to provide uniform density of structures that have the same or similar material. The anchor pad material can have the same or similar planarization selectivity as the interconnect material. The anchor pads and/or interconnect structures from two different IC dies can be partially aligned and joined after a wafer bonding process. Anchor pads from the two IC dies can have substantially similar or different dimensions.

In some embodiments, an image sensor device includes a first die having a first dielectric layer directly on a substrate and a first anchor layer directly formed on the first dielectric layer. The image sensor device also includes a first interconnect structure formed in the first dielectric layer and the first anchor layer. The image sensor device further includes a first anchor pad formed in the first anchor layer and a second die in contact with the first die. The second die includes a second anchor layer on a second dielectric layer. The image sensor device also includes a second interconnect structure in contact with the first interconnect structure and the second interconnect structure is formed in the second dielectric layer and the second anchor layer. The image sensor device also includes a second anchor pad formed in the second anchor layer. The first and second interconnect structures, the first and second anchor layers, and the first and second anchor pads have substantially the same planarization selectivity.

In some embodiments, a method for forming an image sensor device includes providing a substrate and depositing an etch stop layer directly on the substrate. The method further includes depositing a dielectric layer directly on the etch stop layer and depositing an anchor layer directly on the dielectric layer. The method also includes forming a redistribution structure on the substrate and through the dielectric layer and anchor layer. The method further includes forming a plurality of anchor pads in the anchor layer.

In some embodiments, an image sensor system includes a redistribution region having a first redistribution structure and a second redistribution structure bonded at an interface. The image sensor system also includes a pixel region having first and second plurality of anchor pads bonded at the interface. The pixel region includes a plurality of pixels. The image sensor system further includes first and second anchor layers bonded at the interface and extending through the redistribution region and pixel region. The first and second anchor pads are respectively formed in the first and second anchor layers.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An image sensor, comprising:

first and second substrates comprising first and second semiconductor layers, respectively, wherein the first and second semiconductor layers comprise the same material and dopants;

first and second dielectric layers disposed on the first and second substrates, respectively;

first and second anchor layers disposed on the first and second dielectric layers, respectively, and bonded to each other;

first and second pluralities of anchor pads disposed in the first and second anchor layers, respectively, wherein the first and second pluralities of anchor pads are electrically isolated from the first and second substrates by the first and second dielectric layers;

a first interconnect structure, comprising:

a first interconnect portion, disposed in the first semiconductor layer, comprising a first width, and a second interconnect portion, disposed in the first anchor layer and in the first dielectric layer, comprising a second width smaller than the first width, wherein sidewalls of the second interconnect portion are in contact with sidewalls of the first dielectric layer and the first anchor layer, wherein a thickness of a first portion of the second interconnect portion in the first dielectric layer is greater than a thickness of a second portion of the second interconnect portion in the first anchor layer, and wherein the first and second interconnect portions comprise a same material; and a second interconnect structure, comprising:

a third interconnect portion disposed in the second semiconductor layer; and a fourth interconnect portion disposed in the second anchor layer, wherein sidewalls of the second and fourth interconnect portions are vertically aligned to each other, and wherein sidewalls of the fourth interconnect portion are in contact with sidewalls of the second dielectric layer and the second anchor layer.

2. The image sensor of claim 1, wherein each anchor pad in the first and second pluralities of anchor pads comprises a metal layer.

3. The image sensor of claim 1, wherein each of the first and second anchor layers comprises a polymer layer or a dielectric layer.

4. The image sensor of claim 1, wherein a first anchor pad in the first plurality of anchor pads is aligned to a first anchor pad in the second plurality of anchor pads;

wherein a second anchor pad in the first plurality of anchor pads is misaligned with a second anchor pad in the second plurality of anchor pads; and wherein the first and second anchor pads in the first plurality of anchor pads are adjacent to each other.

5. The image sensor of claim 1, wherein a first anchor pad in the first plurality of anchor pads is bonded to the second plurality of anchor pads.

6. The image sensor of claim 1, wherein a first anchor pad in the first plurality of anchor pads is bonded to first and second anchor pads in the second plurality of anchor pads, wherein the first and second anchor pads in the second plurality of anchor pads are adjacent to each other.

7. The image sensor of claim 1, wherein each anchor pad in the first plurality of anchor pads is misaligned with each anchor pad in the second plurality of anchor pads.

8. The image sensor of claim 1, further comprising an etch stop layer disposed between the first substrate and the first dielectric layer, wherein a corner edge formed between a bottom surface of the first interconnect portion and a sidewall of the second interconnect portion is in contact with a corner edge formed between a top surface and a sidewall of the etch stop layer.

9. The image sensor of claim 1, wherein an interface between the first and second anchor layers is on a same plane as an interface between the second and fourth interconnect portions.

10. The image sensor of claim 1, wherein top surfaces and sidewalls of the first and third interconnect portions are non-overlapping with top surfaces and sidewalls of the first and second pluralities of anchor pads.

11. An image sensor, comprising:

first and second semiconductor substrates;

a first dielectric layer disposed on and in contact with the first semiconductor substrate;

a second dielectric layer disposed on and in contact with the second semiconductor substrate, wherein the first and second dielectric layers comprise silicon oxide layers, and wherein the first and second dielectric layers are directly bonded to each other;

first and second pluralities of conductive pads disposed in the first and second dielectric layers, respectively, wherein the first and second pluralities of conductive pads comprise conducting adhesive materials, and wherein each conductive pad in the first plurality of conductive pads is misaligned with each conductive pad in the second plurality of conductive pads;

a first interconnect structure comprising:

a first interconnect portion disposed in the first semiconductor substrate, wherein a bottom surface of the first interconnect portion is in contact with a top surface of the first dielectric layer, and wherein a sidewall of the first interconnect portion is in contact with a sidewall of the first dielectric layer, and a second interconnect portion disposed in the first dielectric layer, wherein sidewalls of the first and second interconnect portions are non-overlapping with each other and with top surfaces of the first plurality of conductive pads, and wherein the first and second interconnect portions comprise the same material; and a second interconnect structure, comprising:

a third interconnect portion disposed in the second semiconductor substrate, and a fourth interconnect portion disposed in the second dielectric layer, wherein sidewalls of the third and fourth interconnect portions are non-overlapping with top surfaces of the second plurality of conductive pads, and wherein the third and fourth interconnect portions comprise the same material.

12. The image sensor of claim 11, wherein:

the first interconnect portion, disposed in the first semiconductor substrate, comprising a first width, and the second interconnect portion, disposed in the first dielectric layer, comprising a second width smaller than the first width.

13. The image sensor of claim 11, wherein the first dielectric layer comprises:

an etch stop layer disposed on the first semiconductor substrate;

an interlayer dielectric layer disposed on the etch stop layer; and an adhesive layer disposed on the interlayer dielectric layer.

14. The image sensor of claim 11, wherein the first dielectric layer comprises an adhesive layer; and wherein a thickness of the adhesive layer is substantially equal to a thickness of each conductive pad in the first plurality of conductive pads.

15. The image sensor of claim 13, wherein a thickness of a first portion of the second interconnect portion in the interlayer dielectric layer is greater than a thickness of a second portion of the second interconnect portion in the etch stop layer and is greater than a thickness of a third portion of the second interconnect portion in the adhesive layer.

16. The image sensor of claim 11, wherein widths of the second and fourth interconnect portions are substantially equal to each other, and wherein sidewalls of the second and fourth interconnect portions are vertically aligned with each other.

17. An image sensor, comprising:

first and second semiconductor substrates;

first and second etch stop layers disposed on the first and second semiconductor substrates, respectively;

first and second dielectric layers disposed on the first and second etch stop layers, respectively;

first and second dielectric anchor layers disposed on the first and second dielectric layers, respectively, and directly bonded to each other;

first and second pluralities of conductive pads disposed in the first and second dielectric anchor layers, respectively, wherein a first conductive pad in the first plurality of conductive pads is bonded to first and second conductive pads in the second plurality of conductive pads, wherein the first conductive pad in the first plurality of conductive pads partially overlaps the first and second conductive pads in the second plurality of conductive pads, and wherein the first and second conductive pads in the second plurality of conductive pads are adjacent to each other and comprise widths equal to each other;

a first conductive structure, comprising:

a first conductive portion disposed in the first semiconductor substrate, and a second conductive portion disposed in the first etch stop, the first dielectric layer, and the first dielectric anchor layer, wherein a corner edge formed between a bottom surface of the first conductive portion and a sidewall of the second conductive portion is in contact with a corner edge formed between a top surface and a sidewall of the first etch stop layer; and a second conductive structure, comprising:

a third conductive portion disposed in the second semiconductor substrate, and a fourth conductive portion disposed in the second etch stop layer, the second dielectric layer, and the second dielectric anchor layer, wherein sidewalls of the fourth conductive portion overlaps sidewalls of the second conductive portion.

18. The image sensor of claim 17, wherein each of the first and second conductive structures comprises a T-shaped cross-sectional profile.

19. The image sensor of claim 17, wherein the first conductive structure and each conductive pad in the first plurality of conductive pads comprise a same conductive material.

20. The image sensor of claim 17, wherein sidewalls of the first and second conductive portions are non-overlapping with each other and with top surfaces of the first plurality of conductive pads.

* * * * *